United States Patent
MacPherson et al.

(10) Patent No.: US 6,486,527 B1
(45) Date of Patent: Nov. 26, 2002

(54) VERTICAL FUSE STRUCTURE FOR INTEGRATED CIRCUITS CONTAINING AN EXPOSURE WINDOW IN THE LAYER OVER THE FUSE STRUCTURE TO FACILITATE PROGRAMMING THEREAFTER

(76) Inventors: John MacPherson, 43017 Mayfair Park Ter., Fremont, CA (US) 94538; Jayaraman Iyer, 4300 The Woods Dr., #1901, San Jose, CA (US) 95136; Alan H. Huggins, 10433 Duke Dr., Gilroy, CA (US) 95020; John S. Starzynski, 1630 Georgetown Way, Salinas, CA (US) 93906; Keith R. Erb, 14601 Tumbleweed La., Watsonville, CA (US) 95076; Dennis L. Lantz, Jr., 1241 Monroe St., Salinas, CA (US) 93906

( * ) Notice: Subject to any disclaimer, the term of this patent is extended or adjusted under 35 U.S.C. 154(b) by 0 days.

(21) Appl. No.: 09/344,613

(22) Filed: Jun. 25, 1999

(51) Int. Cl.$^7$ .................. H01L 29/00; H01L 23/48; H01L 23/52; H01L 29/40
(52) U.S. Cl. .................. 257/529; 257/530; 257/758
(58) Field of Search .................. 257/529, 209, 257/758, 530; 438/132, 215, 281, 333, 467, 601

(56) References Cited

U.S. PATENT DOCUMENTS

| | | |
|---|---|---|
| 4,299,862 A | 11/1981 | Donley |
| 4,413,272 A | 11/1983 | Mochizuki et al. |
| 4,536,949 A | 8/1985 | Takayama et al. |
| 4,875,971 A | 10/1989 | Orbach et al. |
| 5,017,510 A | 5/1991 | Welch et al. |
| 5,023,701 A | 6/1991 | Sharpe-Geisler |
| 5,063,176 A | 11/1991 | Lee et al. |
| 5,084,404 A | 1/1992 | Sharpe-Geisler |
| 5,329,152 A | 7/1994 | Janai et al. |
| 5,464,790 A | 11/1995 | Hawley |
| 5,585,662 A * | 12/1996 | Ogawa .................. 257/529 |
| 5,619,062 A | 4/1997 | Janai et al. |
| 5,663,100 A | 9/1997 | Park et al. |
| 5,679,967 A | 10/1997 | Janai et al. |
| 5,763,323 A | 6/1998 | Kim et al. |
| 5,949,323 A * | 9/1999 | Huggins et al. .......... 337/401 |
| 6,017,824 A * | 1/2000 | Lee et al. .................. 438/712 |
| 6,054,339 A * | 4/2000 | Gilmour et al. .......... 438/132 |
| 6,078,091 A * | 6/2000 | MacPherson et al. ....... 257/529 |
| 6,096,579 A * | 8/2000 | Liao et al. .................. 438/131 |
| 6,100,116 A * | 8/2000 | Lee et al. .................. 438/128 |
| 6,255,715 B1 * | 7/2001 | Liaw .................. 257/529 |
| 6,307,213 B1 * | 10/2001 | Huang et al. .................. 257/50 |

* cited by examiner

Primary Examiner—Eddie Lee
Assistant Examiner—Jesse A. Fenty
(74) Attorney, Agent, or Firm—Pillsbury Winthrop LLP

(57) ABSTRACT

According to the present invention, after manufacture of a disconnect fuse circuit, windows are opened in the insulating film overlying the second interconnect layer at all possible disconnection points, the disconnection points preferably being an exposure window that is aligned over a disconnect fuse circuit that includes a via that electrically connects electrical conductors disposed on different respective layers. This insulating film may consist of one or more layers of one or more materials, but preferentially consists of a single layer of silicon oxide. The wafer is then stored for later configuration. When the wafer is to be configured, a non-precision mask is manufactured. The wafer is coated with photoresist and patterned using the mask to produce disconnection holes in the photoresist at the desired disconnection points. Since the area over the desired disconnection points are free of the insulating film overlying the second patterned interconnect layer, the etching process can be limited to etch techniques which are optimized to etch metal with selectivity to the insulating film. The areas at the disconnection sites that are covered by the insulating film are further protected during the etch process, since the insulating film acts as an etch barrier to inhibit the etching of active circuit elements in proximity to the desired disconnect points.

42 Claims, 11 Drawing Sheets

VERTICAL FUSE STRUCTURE FOR INTEGRATED CIRCUITS CONTAINING AN EXPOSURE WINDOW IN THE LAYER OVER THE FUSE STRUCTURE TO FACILITATE PROGRAMMING THEREAFTER

BACKGROUND OF THE INVENTION

1. Field of the Invention

This invention relates to the manufacture of semiconductor devices. More specifically, it relates to semiconductor devices containing fuses that are disposed in a compact interconnect structure and methods for disconnecting them.

2. Background of the Related Art

Custom electronic devices that are made from standard components suffer from several disadvantages. Since several components are required to implement such a custom device, more circuit board space is required than if a custom or semi-custom integrated circuit had been used in place of the standard components. This makes the overall size of the device larger and more expensive. Also, the assembly process is longer, more costly, and prone to reworks or scrap, since more components are used. Further, a larger number of components usually require more power consumption, which means a larger, heavier, and more expensive power supply. Therefore, the overall size, weight, and cost of the resulting custom device may make it unappealing to the consumer or not competitive when compared to a similar product offered by another company. Accordingly, custom or application-specific integrated circuits (ASICs) are frequently used to implement new circuit designs in the place of standard components.

There are several types of ASICs which are available, depending on size, power, and programmability requirements, and volume of devices used. Fully custom devices offer the lowest cost and least amount of power consumption, but are only economical in very large quantities because of the costs of a custom mask set and engineering design time. Semi-custom devices such as gate arrays require a smaller number of custom masks and design time as compared to fully custom devices, but have a larger die size, cost more to produce, and are typically used when needed quantities are not quite as large. Similarities exist in custom and semi-custom devices in that both have relatively long lead times to produce prototypes and production volumes, and the designs are expensive and time consuming to change. Since the non-recurring costs are so large, it is not economical to produce them in small quantities. Other non-custom devices, such as programmable array logic (PALs), field-programmable gate arrays (FPGAs), and programmable logic devices (PLDs), are fabricated as unprogrammed "blanks" which are programmed by the end user as packaged units or after installation onto a circuit board. These non custom devices have a lower cost basis for smaller quantities, since no custom masks are required. The lead time to produce prototypes and production quantities is short, since the programming is performed near the end of the manufacturing cycle. They are also useful for designs that are expected to undergo revisions, since virtually no programmed material needs to be inventoried. However, these non-custom devices have the drawback of requiring a relatively large amount of die area dedicated to circuitry to perform the programming, and to signal paths to provide flexibility in routing. They are, therefore, more expensive to fabricate and don't achieve the same programmable capacity as custom devices and gate arrays. In some cases, they also use more power and are slower.

Programming of the non custom programmable devices is sometimes accomplished through the use of disconnectable fuses. In this specification, the word fuse will be used to refer to fuses, anti-fuses, disconnection points, disconnectable links, or any combination of these terms. In certain types of programmable devices using electrically disconnectable or connectable fuses, the fuses in the device which define how the circuit is configured are accessed through the I/O pins on the device package. For techniques which require joining conductive regions together (for example, shorting a P/N junction), an excessive amount of current relative to normal operating conditions is passed through the junction, shorting it and allowing current to pass freely. To disconnect a conductive line, a fuse element in an undesired conduction path is subjected to enough current to heat it to its melting point, causing structural breakdown and creating a disconnection. Both of these methods require a relatively large amount of current to program the device. The transistors for generating these large currents in conventional MOS devices require large channel widths. Furthermore, a certain amount of heat insulation area is required around the fuses to prevent thermal damage to neighboring circuitry. This makes it difficult to achieve high device packing densities using these programming methods. Other devices have fuses that are disconnected through the use of a laser or other radiant energy beam device (hereinafter referred to as a "laser"). For these devices, the laser is used to disconnect the fuses near the end of or after the conclusion of the fabrication process. These laser programmable devices have a smaller die size than the electrically programmable devices, and don't require expensive precision custom masks and long lead times like the custom and semi-custom devices. The laser programmable devices are also economical to produce in smaller quantities compared to custom devices.

In addition to using fuses for the customization of an integrated circuit to give it specific circuit or electrical characteristics, fuses have also been used to (1) repair non-functional devices through the selective deletion of defective portions of the circuitry, or by substituting functional redundant circuitry for the defective portions of the circuitry; and (2) mark the device for identification of characteristics in a manner that is readable visually or electrically, for example serialization of the integrated circuit, or how the device has been configured by the laser.

FIG. 1 shows an array of fuses that can be disconnected by a laser. Fuse body 2 on fuse 1 is irradiated by laser beam 7, which has an energy distribution that is approximately radial Gaussian in nature. This energy distribution results in an effective laser spot size 6, that is the area of the beam that has an energy sufficient to disrupt active circuit elements. This disruption can be physical damage that causes the device to be non-functional, or it could cause performance degradation, such as silicon crystal dislocation that causes current leakage. The two characteristics that define the area requirements for a fuse, also called the fuse cell, are the pitch of the fuses in a group, and the length of the fuse. These two dimensions have a direct bearing on how much die area the fuse cell occupies, and thus the overall die size. The pitch 5 of the fuse cell is the distance from the center of one fuse to the center of the nearest neighboring fuse. This dimension is controlled by the requirement that the spot size 6 not disrupt any other fuses, and is conventionally calculated by adding the diameter of the spot size 6 and two times the maximum expected alignment error in the placement of the spot. The length 8 of the fuse is the sum of the length of fuse body 2 and fuse terminals 3. The length 8 of the fuse 1 is controlled by the need to isolate the thermal energy transmitted to the fuse by the laser from interconnect lines 4 attached to the fuse. Another influence to the area requirements of the fuse is whether circuitry can be routed underneath or in close proximity to the fuse. Most design rules specify that all of the area underneath of the fuse, and a certain area around it, be free of active circuitry to protect it from damage. Some designs provide for a barrier at another level between the fuses and the active circuitry and thus utilize some of the area.

As is also well known in the prior art, laser type fuses can alternatively be disconnectable by photolithographic techniques combined with etching to remove a section of the fuse, thus forming a disconnection. Photoresist layer 21 in FIG. 2 is patterned to make a hole 22 in the photoresist over the fuse 24. Well-known etching techniques are then used to etch through the fuse 24, completing the disconnection. As can be seen from FIG. 2, the disconnection can be made cleanly and thoroughly without a risk of damage to any underlying circuitry 25, which would not typically be routed under the fuse, but is shown here to illustrate that such routing can take place if desired.

FIG. 3 illustrates that a smaller disconnection hole 31 on fuse 32 permits a smaller pitch 5. Since the thermal isolation requirements are not needed when using photolithographic techniques, the length of the fuse can also be shortened. The above-mentioned methods of disconnecting fuses can be used, in varying degrees, to reduce required fuse cell area and thus permit a smaller fuse cell and an advantageously smaller die.

An example of the fuse structure from FIG. 1 that is designed with rules optimized for a masking process is shown in FIG. 4. Although the fuse layer in FIGS. 1 and 4 is shown to have an interconnection layer patterned on a layer above it, it should be apparent to one skilled in the art that the fuse layer could be formed as the lop level layer with the interconnect layer at some level below it. The fuse pitch 41 is no longer defined by a laser spot size, but by the minimum spacing 42 between features for the fuse layer 43, as well as the minimum connection pad dimension 44. Since the thermal isolation requirements are not needed when using a masking process, the length 45 of fuse 46 is defined by the minimum linewidth for the fuse layer 47 plus the expected registration and sizing errors of the disconnect hole 48. All of these changes in fuse structure requirements permit a smaller fuse area resulting in an advantageously smaller die. For comparative purposes, the area required for the fuse structure shown in FIG. 1 is the product of dimension 9 (drawn at 16.8 $\mu$m) and dimension 10 (drawn at 14.0 $\mu$m) for a total area of 235.2 $\mu$m$^2$. The area required for the fuse structure shown in FIG. 4 is the product of dimension 49 (equivalent to dimension 9 and drawn at 12.6 $\mu$m) and dimension 50 (equivalent to dimension 10 and drawn at 8.4 $\mu$m) for a total area of 105.8 $\mu$m$^2$.

A further reduction in the area required for a fuse structure can be realized by making use of a vertical fuse at the connection point between two interconnect lines. FIG. 5a shows a top view of the fuse structure from FIG. 1 and FIG. 4 that is designed using vertical fuses. The cross-section of FIG. 5b is taken along the line B–B' from FIG. 5a. An insulating material such as doped or undoped silicon dioxide 51 is formed over first interconnect layer 52 and patterned to form a plurality of vias 53. A filler material for vias 53, such as tungsten plug 54, is used to fill vias 53 and provide a connection to a second interconnect layer 55. A disconnectable conduction path is thus formed between the first interconnect layer 52 and the second interconnect layer 55 through plug 54. At the time that the circuit is ready for customization or repair, a photoresist layer 56 is applied and patterned with disconnect hole 61, and a core section of material 62 is removed using etching techniques, forming a disconnection 63 as shown in FIG. 5c.

The length 57 of the fuse structure is defined by the minimum spacing 58 between features on the second interconnect layer 55, and the minimum connection pad dimension 59. The width of the fuse structure 60 is defined by the minimum connection pad dimension 59. For comparative purposes to the fuse structures shown in FIG. 1 and FIG. 4, the area required for the fuse structure shown in FIG. 5a is the product of dimension 57 (drawn at 17.4 $\mu$m) and dimension 60 (drawn at 3.0 $\mu$m) for a total area of 52.2 $\mu$m$^2$.

While the vertical fuse structure shown in FIGS. 5a–5c requires the smallest amount of area to implement, it suffers from some disadvantages. The disconnect hole 61 must be small and precisely positioned, requiring the use of expensive precision lithography equipment, precision masks for each design, and the use of more expensive lithography materials and processes, incurring a relatively high manufacturing cost for the device. If the disconnect hole 61 is too large, or misplaced such that it overlaps the vertical fuse structure 64 creating gaps 65 as shown in FIG. 6, the etch processes required to remove the vertical fuse structure 64 and customize the circuit can damage the first interconnect layer 52, as shown in FIG. 7. An alternative to the precision lithography processing would be to deposit insulating layer 67 after customization, since less etching would be required and the risk of damage to the first interconnect layer 52 would be minimized. However, insulating layer 67 is required to prevent corrosion of the sidewalls of second interconnect layer 55 during storage of the unconfigured circuits, so this processing sequence would not permit material to be stored for later customization, requiring a significant amount of planning to avoid shortfalls of material or scraps because it was not used before being damaged by corrosion. Another alternative would be to increase the top surface dimension of second interconnect layer 55, so that such dimension is at least as large as that of the disconnect hole 61, but this results in an undesirable increase in the die size. Still another alternative would be to avoid routing circuitry under the fuse structure 64, but this also results in an undesirable increase in the die size.

It is therefore desirable to have a structure and method for customizing a device using a vertical fuse without the need for precision masking equipment and processes, that permits the deposition of a protective layer over the vertical fuse structure, while allowing for the use of active circuitry below such a vertical fuse, and without increasing the dimensions of the second interconnect lines, thereby maintaining an efficient layout of the circuitry and a small die size while reducing processing costs.

SUMMARY OF THE INVENTION

It is an object of this invention to decrease the amount of space required for a disconnectable link, or an array of disconnectable links which form a specific circuit such as an AND array, thus reducing the overall size of the integrated circuit, without the need for precision photolithography at the customization step.

It is another object of the present invention to provide a fuse structure and a method of disconnecting a fuse that allows for active circuitry to be disposed below the fuses and not damaged during fuse disconnection.

It is another object of this invention to reduce the cost of manufacturing an integrated circuit by permitting the use of non-precision photolithography techniques to perform the customization.

In one embodiment of the invention, after manufacture of a disconnect fuse circuit, windows are opened in the insulating film overlying the second interconnect layer at all possible disconnection points, the disconnection points preferably being an exposure window that is aligned over a disconnect fuse circuit that includes a via that electrically connects electrical conductors disposed on different respective layers. This insulating film may consist of one or more layers of one or more materials, but preferentially consists of a single layer of silicon oxide. The wafer is then stored for later configuration. When the wafer is to be configured, a non-precision mask is manufactured. The wafer is coated with photoresist and patterned using the mask to produce disconnection holes in the photoresist at the desired disconnection points. Since the area over the desired disconnection points are free of the insulating film overlying the second patterned interconnect layer, the etching process can be limited to etch techniques which are optimized to etch metal with selectivity to the insulating film. The areas at the disconnection sites that are covered by the insulating film are further protected during the etch process, since the insulating film acts as an etch barrier to inhibit the etching of active circuit elements in proximity to the desired disconnect points.

The invention also allows an additional film or films to be deposited on top of the insulating layer. This film is selected to have properties wherein it will have a high level of selectivity to the metal etch process, and will thus function as a more effective etch barrier than the insulating layer alone.

Furthermore, the invention allows for the insulating layer to be formed using planarization techniques, such that it provides a thicker layer of insulating material over the active circuit elements to be protected, thus providing a more effective etch barrier.

BRIEF DESCRIPTION OF THE DRAWINGS

The above and other objects, features, and advantages of the present invention are further described in the detailed description which follows, with reference to the drawings by way of non-limiting exemplary embodiments of the present invention, wherein like reference numerals represent similar parts of the present invention throughout several views and wherein:

FIGS. 5b–5c illustrate a method of disconnecting the interconnect structure of FIG. 5a;

FIGS. 6–7 illustrate another method of disconnecting the interconnect structure of FIG. 5a;

DETAILED DESCRIPTION OF THE PREFERRED EMBODIMENTS

While the present invention will be described herein with reference to particular embodiments thereof, a latitude of modifications, various changes and substitutions are intended, and it will be appreciated that in some instances some features of the invention will be employed without a corresponding use of other features without departing from the spirit and scope of the invention as described with respect to the preferred embodiments set forth herein.

Figure 1:
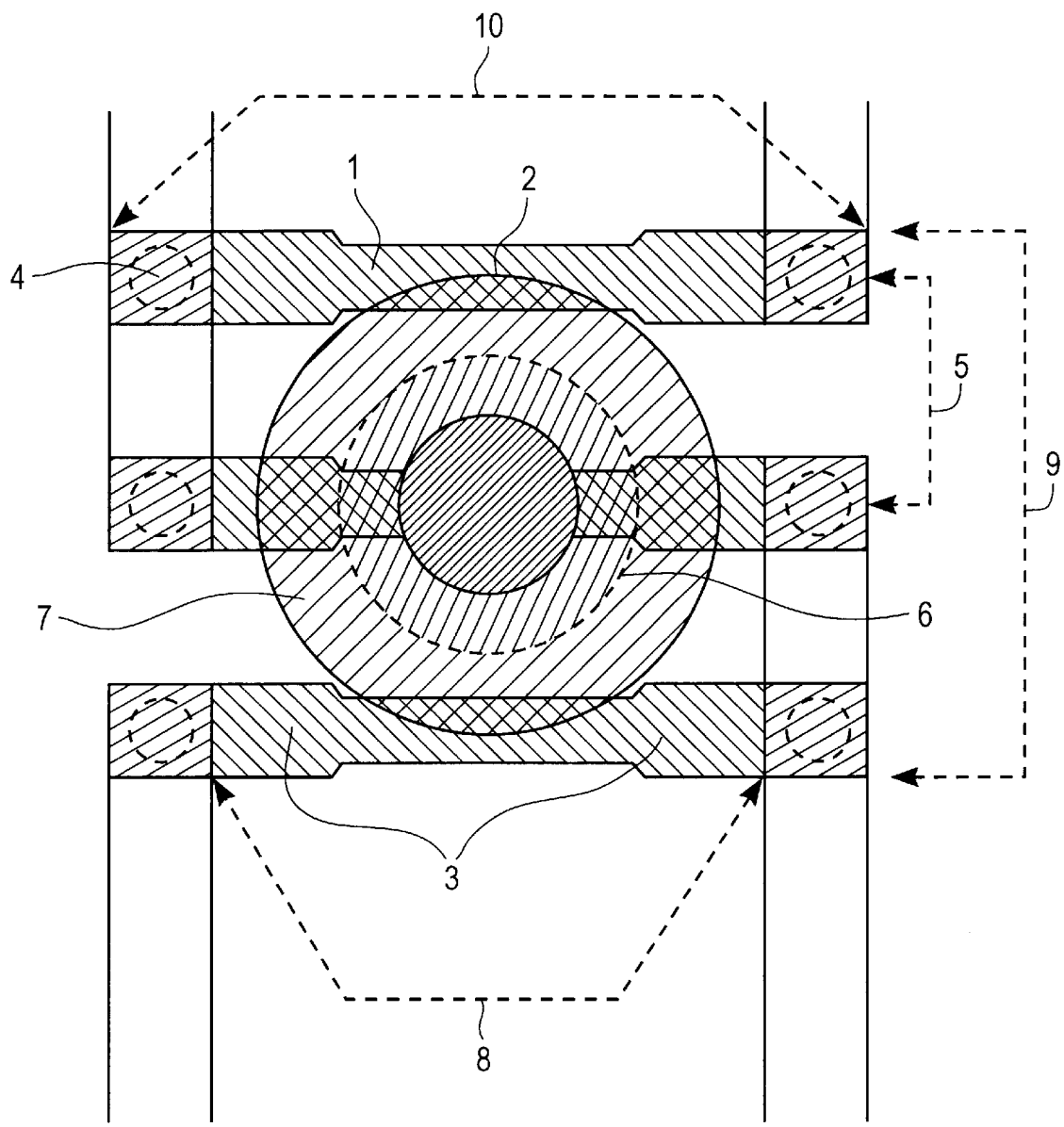
FIG. 1 is a top plan view of a conventional fuse array within an integrated circuit device that illustrates the use of a laser to disconnect a conventional fuse within the fuse array, and the dimensions needed for fuses when conventional fuses are disconnected using laser or photolithographic techniques.
Figure 2:
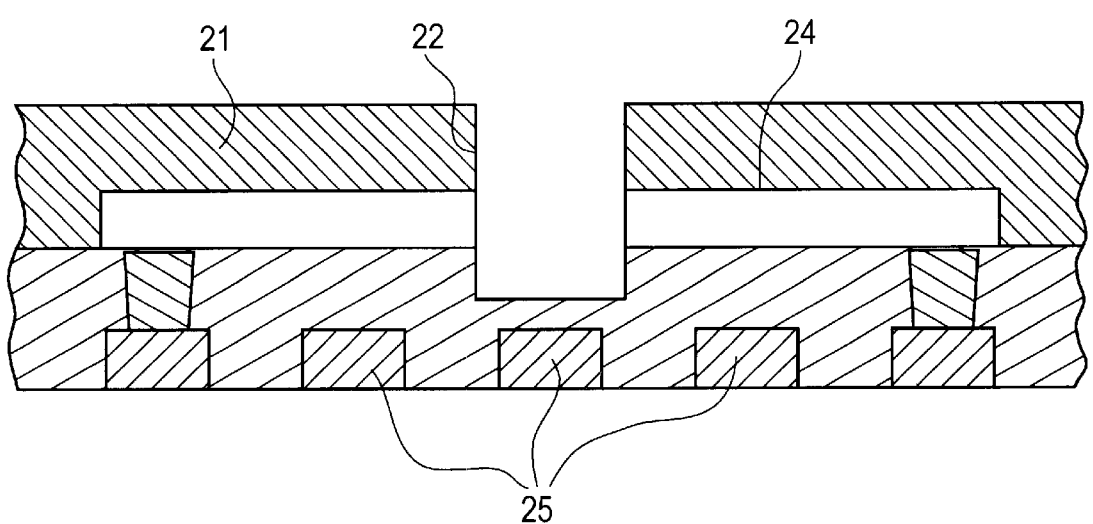
FIG. 2 is a side elevation cutaway view of a conventional fuse structure within an integrated circuit device that illustrates the use of photolithographic techniques combined with etching to disconnect a conventional fuse.
Figure 3:
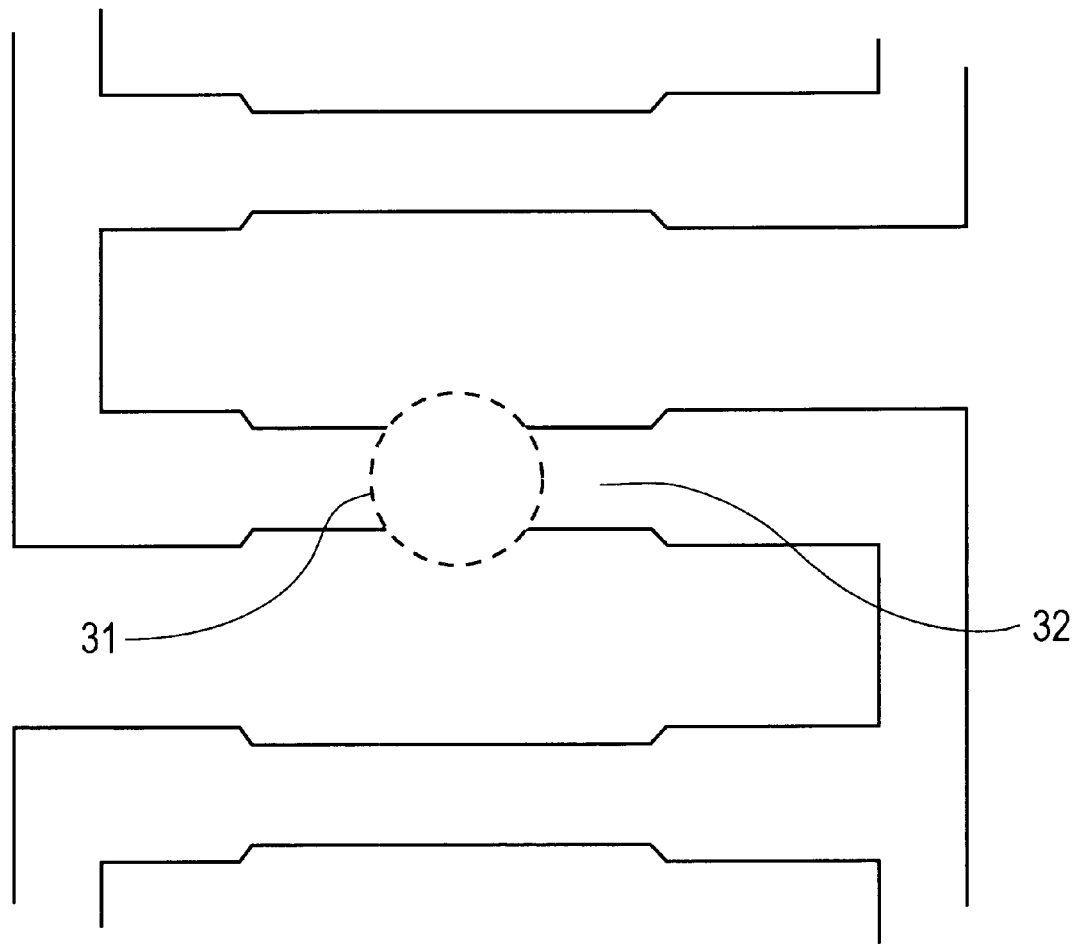
FIG. 3 is a top plan view of a conventional fuse array illustrating the ability to design smaller dimension fuses due to the use of photolithographic techniques combined with etching to disconnect a conventional fuse within the fuse array.
Figure 4:
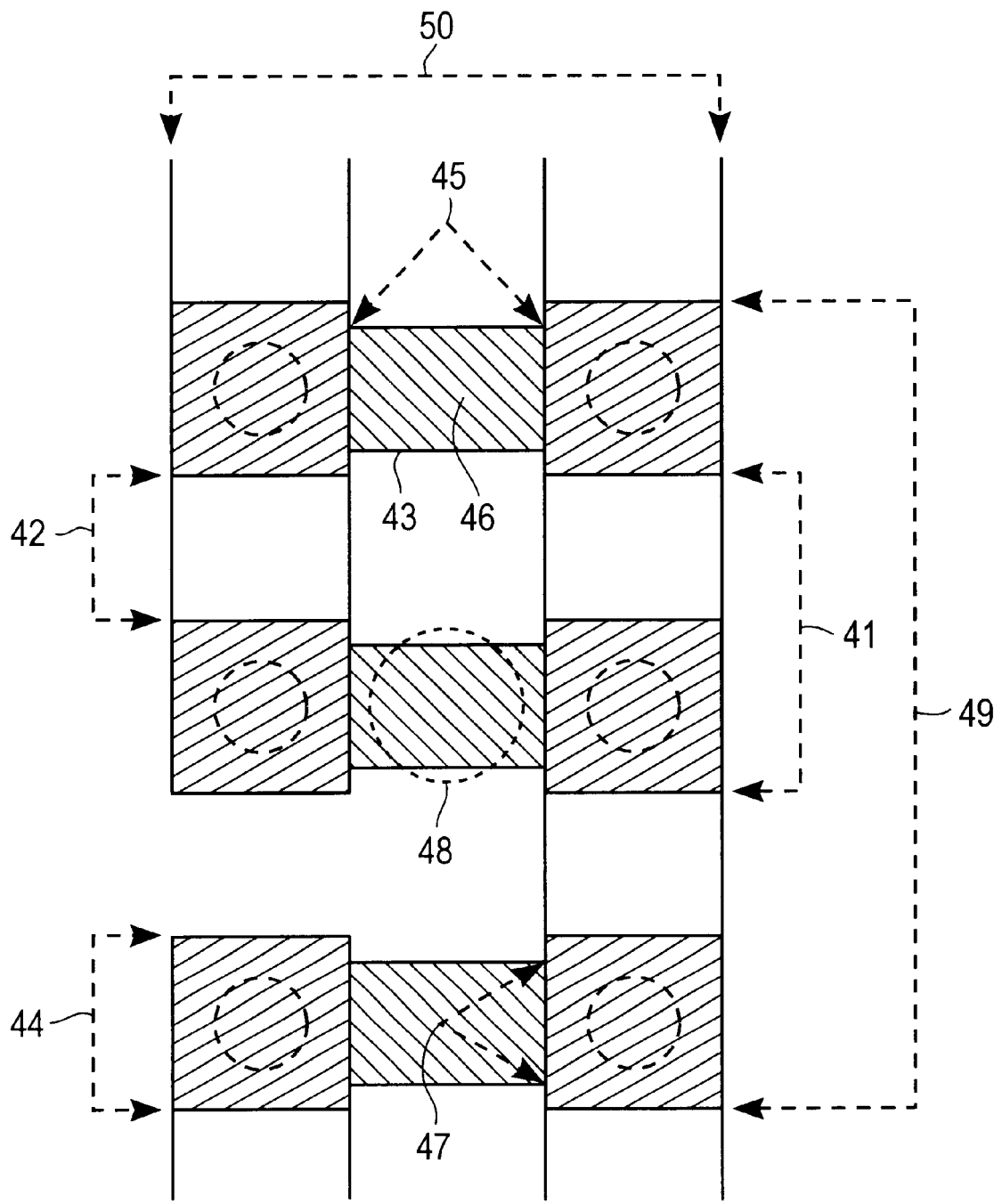
FIG. 4 is a top plan view illustrating the dimensions needed for fuses when conventional fuses are disconnected using a photolithographic technique.
Figure 5A:
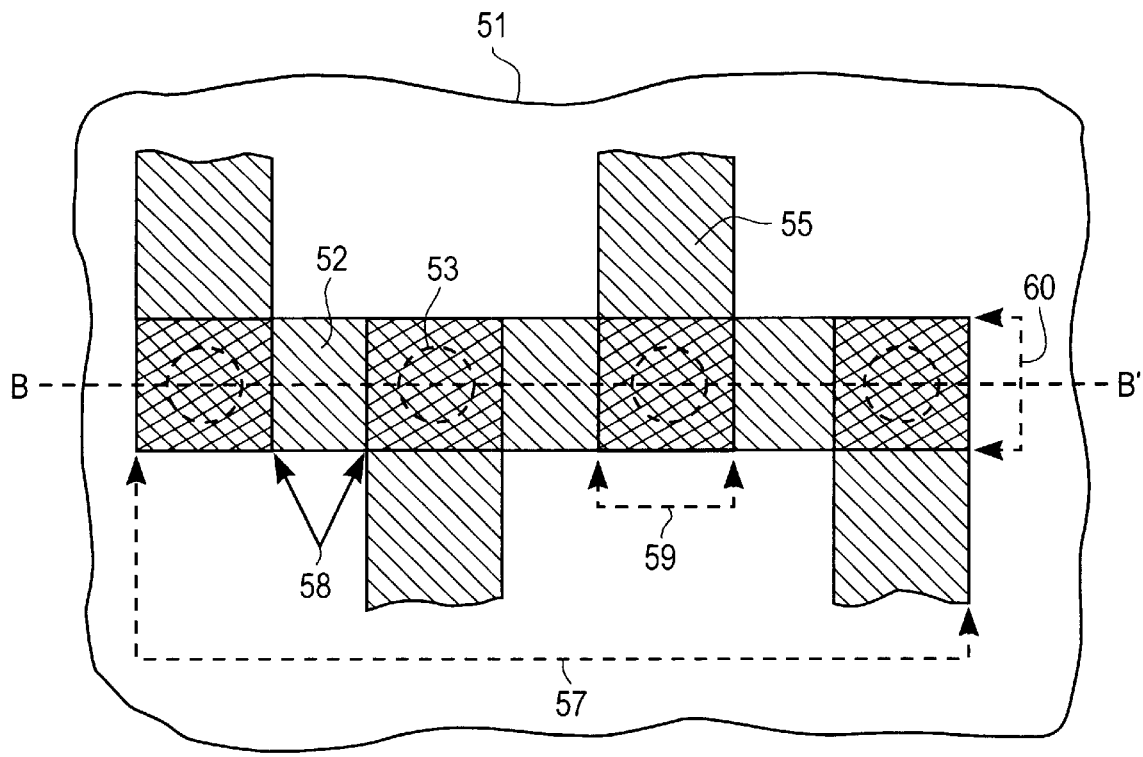
FIG. 5a is a top plan view illustrating the dimensions needed for fuses when vertical fuses are disconnected using a photolithographic technique.
Figure 5B:
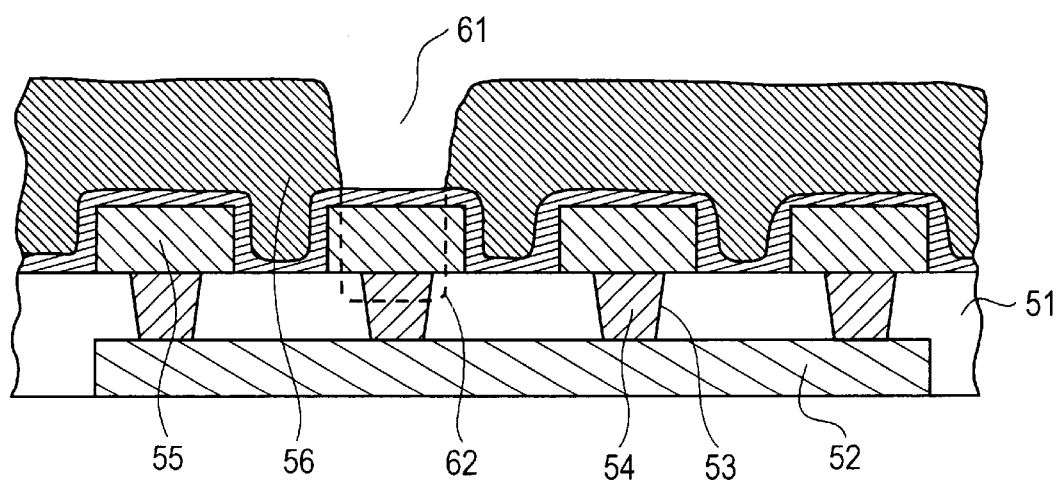
Figure 5C:
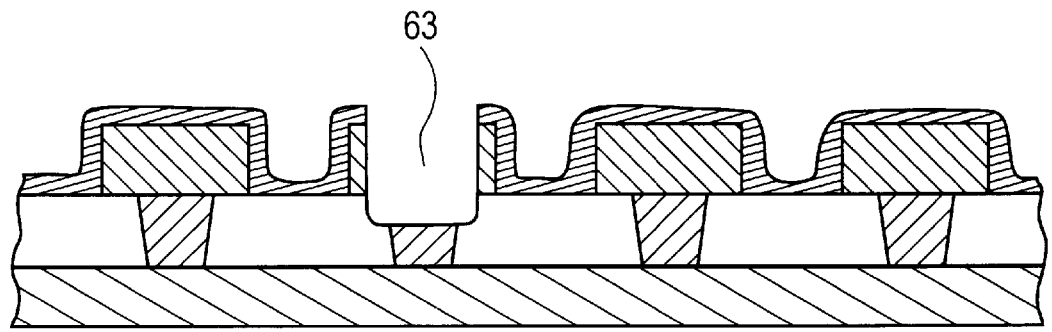
Figure 6:
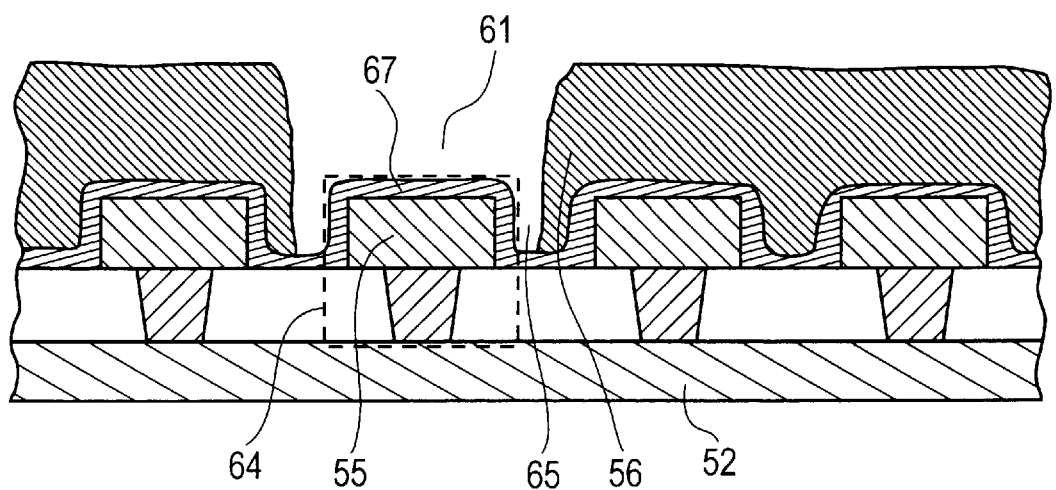
Figure 7:
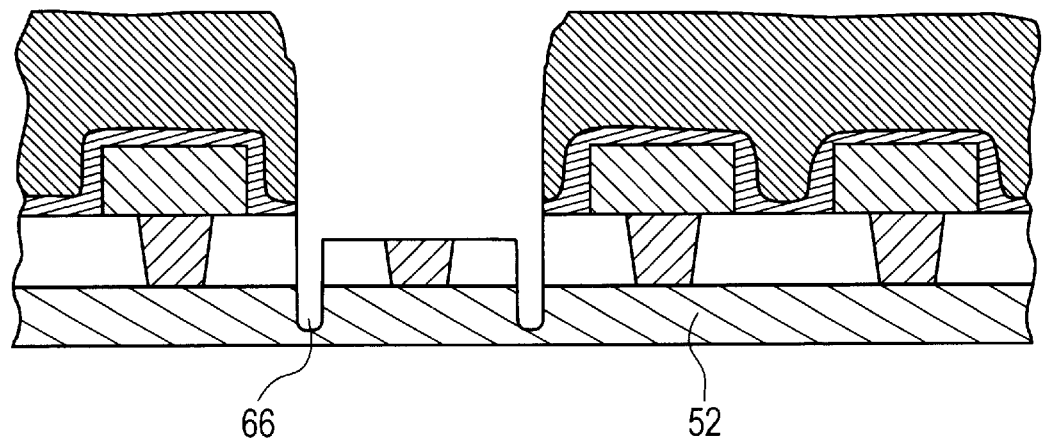
Figure 8:
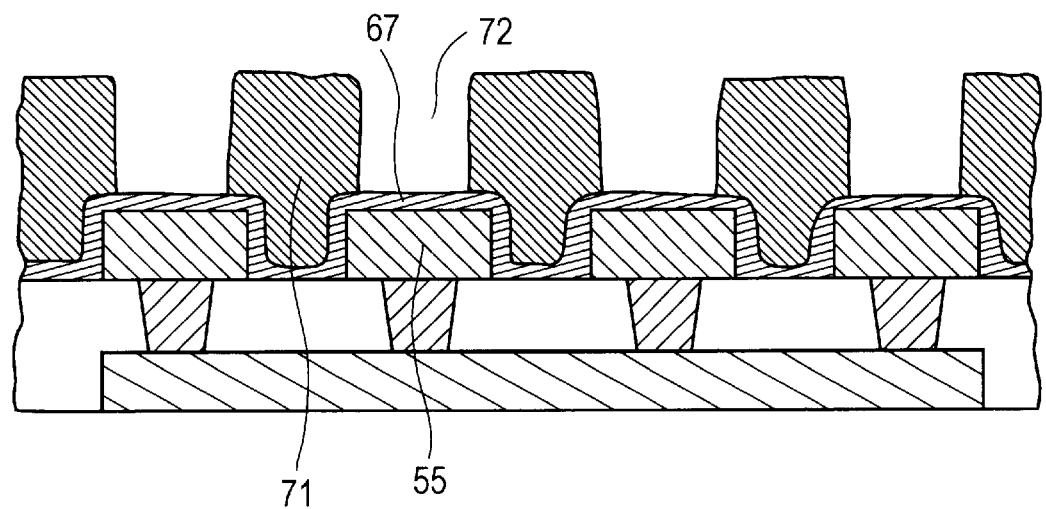
FIGS. 8–10 illustrate a method of disconnecting the interconnect structure of FIG. 5a according to the present invention.
Figure 9:
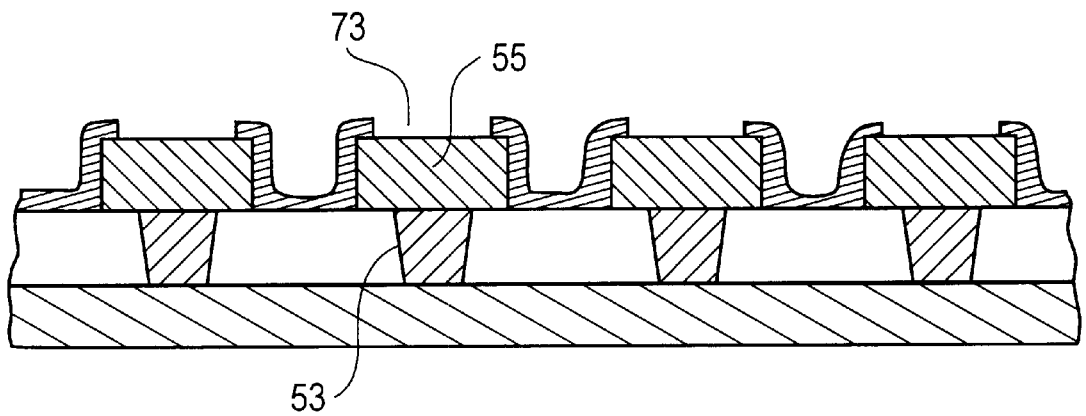

The cross-section of FIG. 8, prior to the steps described hereafter, is the same as that taken along the line B–B' from FIG. 5a. Accordingly, the same numeric designations are used to represent the same elements throughout the descriptions and figures. After creation of the fuses for each of the dies on a wafer, photoresist 71 is applied and patterned using a standard precision mask to provide openings 72 above all possible disconnect locations of the fuses. The insulating layer 67 is then etched to create fuse windows 73 at each possible disconnect location as shown in FIG. 9. The photoresist 71 is then removed using conventional techniques. The fuse windows 73 expose a portion of the top of second interconnect layer 55 overlying vias 53 for each fuse. As is apparent, each of the fuse windows 73 are preferably created such that the fuse window 73 does not overlap the edge of the respective second interconnect layer 55 and is therefore formed entirely over the second interconnect layer 55. The wafer that includes each of these circuits can now be stored for configuration at a later date. It should be noted that in the preferred embodiment the fuse windows expose the top portion disconnect location at the top of the interconnect layer 55. The interconnect layer 55, however, need not be filly exposed at each fuse window 73 to practice the present invention. Rather, thinning the materials above the disconnect location at the top of the interconnect layer 55 will enable the subsequent etching to be more easily made and is within the intended scope of the invention, as described further hereinafter.

Figure 10:
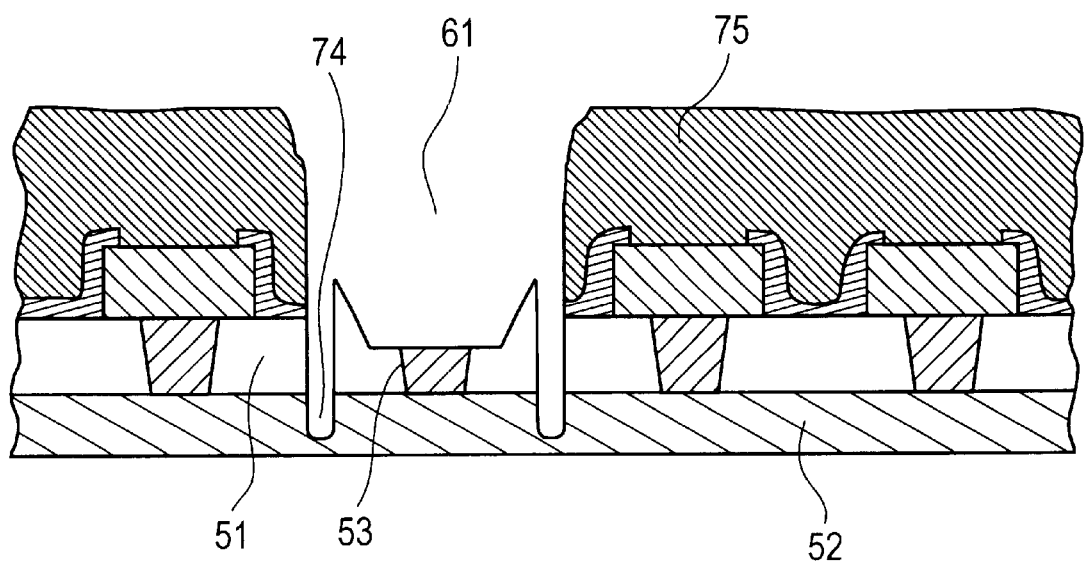

At the time that the circuit is ready for customization or repair, a photoresist layer 75 in FIG. 10 is applied and patterned, preferably using a non-precision custom mask, or, alternatively, using an energy beam, such as a laser, an ion beam or an electron beam, to cover the fuse elements that do not require disconnection and to expose the desired disconnection points. Thus, disconnection holes 61 that exist within the non-precision mask expose only those fuses in the circuit that require disconnection. The etch steps previously required during the customization step to remove the insulating layer 67 are no longer required, since fuse windows 73, aligned with the disconnection holes 61, now permit the second patterned interconnect layer 55 to be etched directly at each of the disconnect holes 61. Thus, the etching can be limited to that required to create a disconnection between the second interconnect layer 55 and the via 53 using the disconnect holes 61 as a guide. This has many benefits. First, larger geometries, which can be created with non-precision photolithographic processing and materials, can be used to configure the fuse. While the second etch could use precision photolithographic processing, one of the advantages of the invention are that the photolithographic processing equipment used to make the mask with disconnect holes 61 can have less precision that than that used to make the mask that openings that create the fuse windows 73. The size, therefore, of the disconnect holes 61 can be larger than the size of the openings in the mask used to create each of the fuse exposure windows 73., Also, since less overall etching time is required, there is less erosion of the insulating layer 51 covering the first patterned interconnect layer, and the insulating layer 51 that remains acts as an etch barrier to inhibit the etching of active circuit elements in proximity to the desired disconnect points. Thus the trench 74 created in the insulating layer 51 will not penetrate to and damage the underlying first interconnect layer 52, or circuitry disposed below first interconnect layer 52, such as transistor gates, polysilicon resistors or other circuit elements, as shown in FIG. 10.

Furthermore, the fuse windows 73 can be etched at the same processing step used to open bond pads on the device for testing prior to storage of the device. Thus, the etch step to remove the insulating layer 67 during the fuse disconnection processing is eliminated. This further lowers the cost of the disconnection processing.

Figure 11:
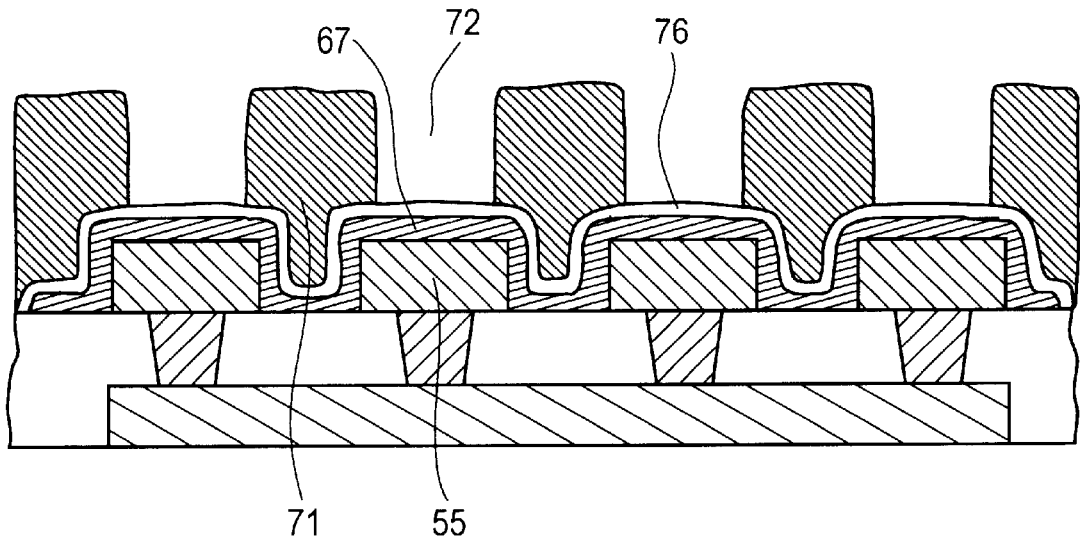
FIGS. 11–12 illustrate another method of disconnecting the interconnect structure of FIG. 5a according to the present invention.
Figure 12:
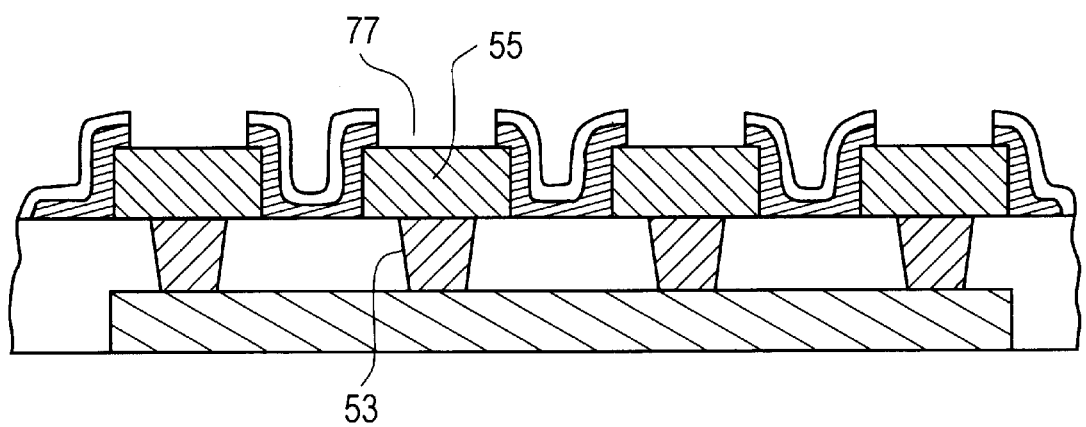

In another embodiment of the present invention, a protective film is deposited over the fuse structure to further protect undesirable erosion of the insulating layer, as shown in FIG. 11, A layer of protective film 76 is deposited over the insulating layer 67. This protective film may be a film commonly deposited over the device as a protection layer from scratches or moisture, or it may be added as an aspect of this invention. This protective film 76 is preferentially selected from a group of materials that are resistant to the etching process used to etch the second interconnect layer 55 and create the disconnection. For example, materials with saturated bonds such as diamond and graphite, or photoresist which has been implanted to form a carbonized surface layer; or materials which will produce etch by-products with a low vapor pressure relative to that used for the etch processing, such as copper etched using chlorine gas, or aluminum etched using fluorine gas. Other combinations of thin film materials and etch gases can be selected to produce involatile etch byproducts, which are condensed or formed over the undesired etchable material, reducing the etch rate in these areas. For example, local sputtering and reactive transport of resist material onto the undesired etchable areas. Alternatively, the protective film can consist of conventional semiconductor materials such as doped or undoped silicon oxide and silicon nitride, or combinations of any of the aforementioned materials. After protective film 76 is deposited, a photoresist 71 is applied and patterned to provide openings 72 above all possible disconnect locations. The protective film 76 and the insulating layer 67 are etched to create fuse windows 77, and the photoresist 71 is then removed, as shown in FIG. 12. The fuse windows 77 expose a portion of the top of second interconnect layer 55 overlying vias 53. At the time that the circuit is ready for customization or repair, the process steps as described in the previous embodiment relative to FIG. 10 are performed. The protective film 76 provides and additional barrier to the etching, further enhancing the protection of underlying circuit elements from damage.

Figure 13:
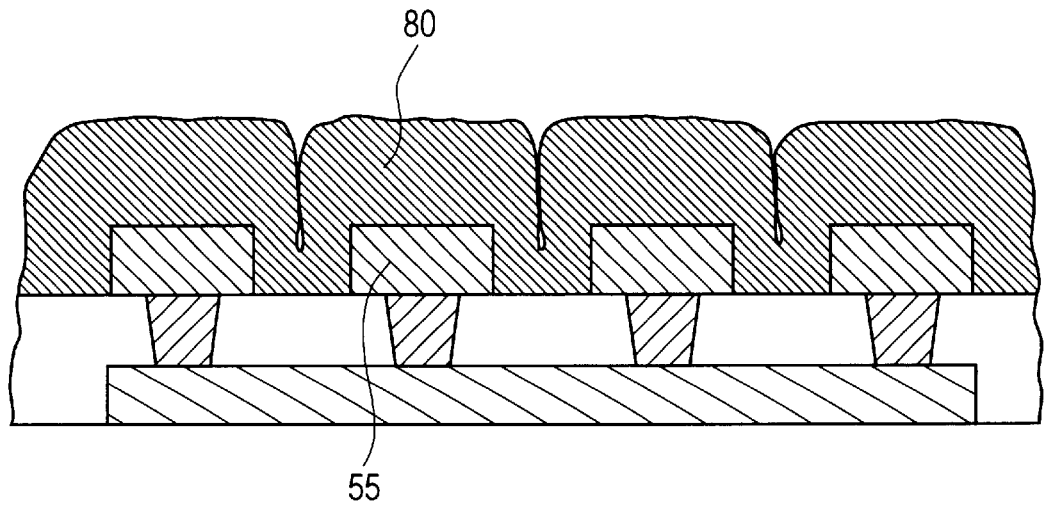
FIGS. 13–16 illustrate yet another method of disconnecting the interconnect structure of FIG. 5a according to the present invention.
Figure 14:
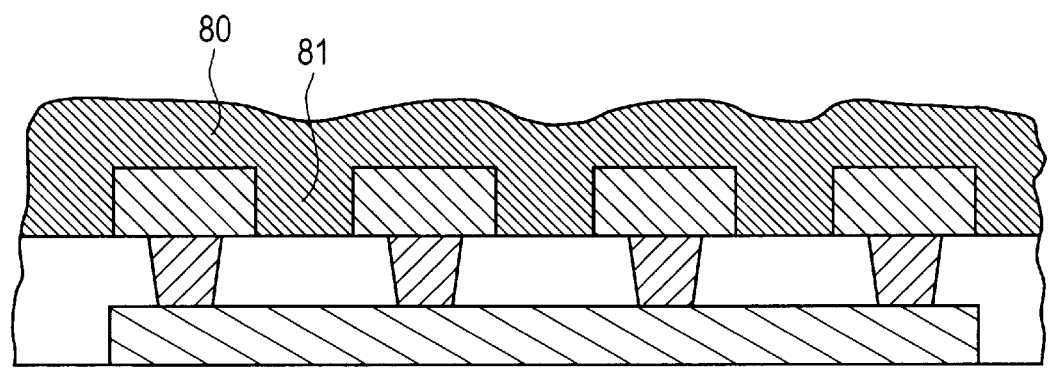
Figure 15:
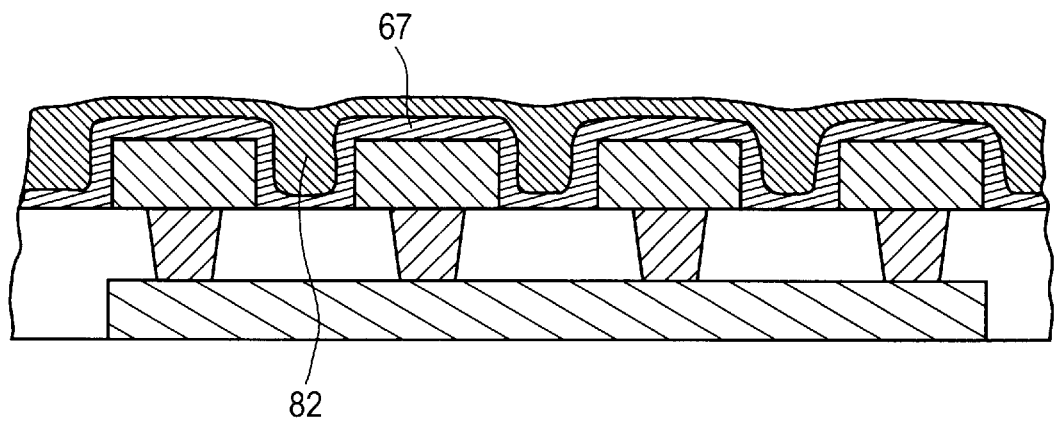
Figure 16:
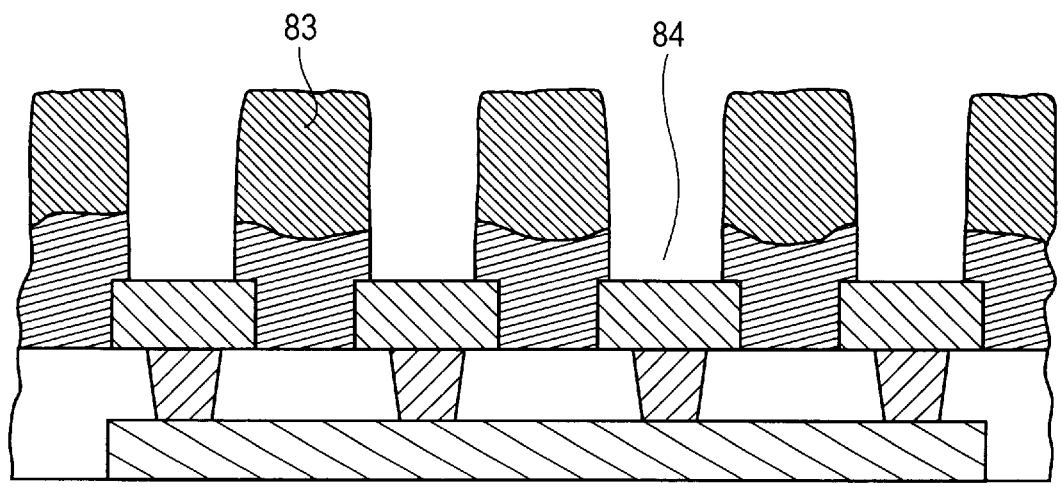

In yet another embodiment of the present invention, a thicker layer of the insulating layer overlying the second patterned interconnect layer is used to provide a physical barrier to the etching process. A relatively thick layer of insulating material 80 is deposited over the second patterned interconnect layer 55, as shown in FIG. 13. The thickness of this insulating layer 80 can be optimized for a specific application, but is generally given to be in a range of 1.5 to 2.0 times the thickness of the second patterned interconnect layer 55. Planarization techniques well-known in the art, such as photoresist application and etchback, chemical-mechanical polish (CMP), or spin-on glass (SOG) application and etchback, are used to planarize the insulating layer 80, at least partially filling or reducing the size of the gaps 81 as shown in FIG. 14. Alternatively, a material 82 such as SOG or polyimide may be applied directly to the insulating layer 67 to achieve approximately the same topography, as shown in FIG. 15. In either case, a layer of photoresist 83 is applied and patterned, as shown in FIG. 16, and etching techniques are utilized to provide a fuse window 84 over each disconnection site. As in the other embodiments, the processing described relative to FIG. 10 is used to configure the circuit.

While the present invention has been described herein with reference to particular embodiments thereof, a latitude of modifications, various changes and substitutions are intended in the foregoing disclosure, and it will be appreciated that in some instances some features of the invention will be employed without a corresponding use of other features without departing from the spirit and scope of the invention as set forth in the appended claims.

We claim:

1. An integrated circuit structure capable of being programmed comprising:
   a substrate; and
   a plurality of disconnectable fuses formed over the substrate and adjacent to one another, each of the plurality of disconnectable fuses including:
      a first interconnect layer disposed above the substrate;
      a first insulator layer disposed above the first interconnect layer;
      a second interconnect layer disposed above the second insulator layer;
      a via disposed in the second insulator layer electrically connecting the first interconnect layer to the second interconnect layer, and
      another layer disposed on and over the second interconnect layer, the another layer including a exposure window aligned with and having a top surface area larger than a top surface area of the via disposed below, wherein the exposure window is a thinned portion of the another layer, such that said thinned portion facilitates the subsequent programming of the integrated circuit structure by etching of the second interconnect layer and at least a portion of the via at the exposure window of the fuse to be etched.

2. An integrated circuit structure according to claim 1 wherein said substrate includes active circuitry, wherein the another layer of each disconnectable fuse has other portions with a thickness greater than that of said thinned portions; and wherein the active circuitry is protected by the other portions of the another layer during programming.

3. An integrated circuit structure according to claim 1 wherein the another layer is an insulator.

4. An integrated circuit structure according to claim 1 wherein the plurality of disconnectable fuses are formed in an array.

5. An integrated circuit structure according to claim 1 wherein each of the plurality of disconnectable fuses further includes a protective layer disposed over the another layer, and wherein the protective layer includes another exposure window aligned with the exposure window of the another layer.

6. An integrated circuit structure according to claim 1 wherein the first interconnect layer, the second interconnect layer and the via are made of metal.

7. An integrated circuit structure capable of being programmed comprising:
   a substrate; and
   a plurality of disconnectable fuses formed over the substrate and adjacent to one another, each of the plurality of disconnectable fuses including:
      a first interconnect layer disposed above the substrate;
      a first insulator layer disposed above the first interconnect layer;
      a second interconnect layer disposed above the second insulator layer;
      a via disposed in the second insulator layer electrically connecting the first interconnect layer to the second interconnect layer, and
      another insulating layer disposed on and over the second interconnect layer, the another insulating layer including an exposure window aligned with and having a top surface area larger than a top surface area of the via disposed below, wherein the another insulating layer is completely removed within the exposure window to facilitate the subsequent programming of the integrated circuit structure by etching of the second interconnect layer and at least a portion of the via at the exposure window of the fuse to be etched.

8. An integrated circuit structure according to claim 7 wherein said substrate includes active circuitry, wherein the another insulating layer of each disconnectable fuse has other portions; and wherein the active circuitry is protected by the other portions of the another layer during programming.

9. An integrated circuit structure according to claim 7 wherein the plurality of disconnectable fuses are formed in an array.

10. An integrated circuit structure according to claim 7 wherein each of the plurality of disconnectable fuses further includes a protective layer disposed over the another insulating layer, and wherein the protective layer includes another exposure window aligned with the exposure window of the another insulating layer so that the another insulating layer is completely removed within the exposure window of the protective layer.

11. An integrated circuit structure according to claim 10 wherein the first interconnect layer, the second interconnect layer and the via are made of metal.

12. An integrated circuit structure according to claim 7 wherein the first interconnect layer, the second interconnect layer and the via are made of metal.

13. An integrated circuit structure according to claim 12 wherein the plurality-of disconnectable fuses are formed in an array.

14. An integrated circuit structure according to claim 12 wherein each of the plurality of disconnectable fuses further includes a protective layer disposed over the another layer, and wherein the protective layer includes another exposure window aligned with the exposure window of the another layer.

15. An integrated circuit structure according to claim 14 wherein said substrate includes active circuitry, wherein the another layer of each disconnectable fuse has other portions with a thickness; and wherein the active circuitry is protected by the other portions of the another layer during programming.

16. An integrated circuit structure capable of being programmed comprising:
   a substrate; and
   a plurality of disconnectable fuses formed over the substrate and adjacent to one another, such that the plurality of disconnectable fuses includes all of the disconnectable fuses on the substrate, each of the plurality of disconnectable fuses including:
      a first interconnect layer disposed above the substrate;
      a first insulator layer disposed above the first interconnect layer;
      a second interconnect layer disposed above the second insulator layer;
      a via disposed in the second insulator layer electrically connecting the first interconnect layer to the second interconnect layer, and
      another layer disposed on and over the second interconnect layer, the another layer including a exposure window aligned with and having a top surface area larger than a top surface area of the via disposed below that facilitates the subsequent programming of the integrated circuit structure by etching of the second interconnect layer and at least a portion of the via at the exposure window of the fuse to be etched.

17. An integrated circuit structure according to claim 16 wherein the exposure window is a thinned portion of the another layer.

18. An integrated circuit structure according to claim 17 wherein said substrate includes active circuitry, wherein the another layer of each disconnectable fuse has other portions with a thickness greater than that of said thinned portions; and wherein the active circuitry is protected by the other portions of the another layer during programming.

19. An intergrated circuit structure according to claim 17 wherein the another layer is formed on the second interconnect layer.

20. An integrated circuit structure according to claim 19 wherein the another layer is an insulator.

21. An integrated circuit structure according to claim 19 wherein the plurality of disconnectable fuses are formed in an array.

22. An integrated circuit structure according to claim 19 wherein each of the plurality of disconnectable fuses further includes a protective layer disposed over the another layer, and wherein the protective layer includes another exposure window aligned with the exposure window of the another layer.

23. An integrated circuit structure according to claim 19 wherein the first interconnect layer, the second interconnect layer and the via are made of metal.

24. An integrated circuit structure according to claim 19 wherein said substrate includes active circuitry, wherein the another layer of each disconnectable fuse has other portions with a thickness greater than that of said thinned portions; and wherein the active circuitry is protected by the other portions of the another layer during programming.

25. An integrated circuit structure according to claim 24 wherein the plurality of disconnectable fuses are formed in an array.

26. An integrated circuit structure according to claim 25 wherein the first interconnect layer, the second interconnect layer and the via are made of metal.

27. An integrated circuit structure according to claim 16 wherein the exposure window is formed by completely removing the another insulating layer within the exposure window.

28. An integrated circuit structure according to claim 27 wherein said substrate includes active circuitry, wherein the another layer of each disconnectable fuse has other portions with a thickness; and wherein the active circuitry is protected by the other portions of the another layer during programming.

29. An integrated circuit structure according to claim 27 wherein the another layer is formed on the second interconnect layer.

30. An integrated circuit structure according to claim 29 wherein the another layer is an insulator.

31. An integrated circuit structure according to claim 29 wherein the plurality of disconnectable fuses are formed in an array.

32. An integrated circuit structure according to claim 29 wherein each of the plurality of disconnectable fuses further includes a protective layer disposed over the another layer, and wherein the protective layer includes another exposure window aligned with the exposure window of the another layer.

33. An integrated circuit structure according to claim 29 wherein the first interconnect layer, the second interconnect layer and the via are made of metal.

34. An integrated circuit structure according to claim 29 wherein said substrate includes active circuitry, wherein the another layer of each disconnectable fuse has other portions with a thickness; and wherein the active circuitry is protected by the other portions of the another layer during programming.

35. An integrated circuit structure according to claim 34 wherein the plurality of disconnectable fuses are formed in an array.

36. An integrated circuit structure according to claim 35 wherein the first interconnect layer, the second interconnect layer and the via are made of metal.

37. An integrated circuit structure according to claim 16 wherein the another layer is an insulator.

38. An integrated circuit structure according to claim 16 wherein the plurality of disconnectable fuses are formed in an array.

39. An integrated circuit structure according to claim 16 wherein each of the plurality of disconnectable fuses further includes a protective layer disposed over the another layer, and wherein the protective layer includes another exposure window aligned with the exposure window of the another layer.

40. An integrated circuit structure according to claim 39 wherein the first interconnect layer, the second interconnect layer and the via are made of metal.

41. An integrated circuit structure according to claim 40 wherein said substrate includes active circuitry, wherein the another layer of each disconnectable fuse has other portions with a thickness; and wherein the active circuitry is protected by the other portions of the another layer during programming.

42. An integrated circuit structure according to claim 41 wherein the plurality of disconnectable fuses are formed in an array.

* * * * *